United States Patent
Bergemont

[11] Patent Number: 6,118,157
[45] Date of Patent: *Sep. 12, 2000

[54] HIGH VOLTAGE SPLIT GATE CMOS TRANSISTORS BUILT IN STANDARD 2-POLY CORE CMOS

[75] Inventor: Albert Bergemont, Palo Alto, Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/044,220

[22] Filed: Mar. 18, 1998

[51] Int. Cl.[7] .................................................. H01L 29/78
[52] U.S. Cl. .......................................... 257/366; 257/355
[58] Field of Search ................................... 257/355–363, 257/365, 366, 315, 316

[56] References Cited

U.S. PATENT DOCUMENTS

| | | | |
|---|---|---|---|
| 5,012,315 | 4/1991 | Shur | 357/23.14 |
| 5,100,819 | 3/1992 | Gill et al. | 437/43 |
| 5,373,183 | 12/1994 | Beasom | 257/487 |
| 5,528,056 | 6/1996 | Shimada et al. | 257/72 |
| 5,608,243 | 3/1997 | Chi et al. | 257/249 |
| 5,796,139 | 8/1998 | Fukase | 257/316 |

*Primary Examiner*—David B. Hardy
*Attorney, Agent, or Firm*—Skjerven Morrill MacPherson Franklin & Friel LLP; Edward C. Kwok

[57] ABSTRACT

A split-gate MOS transistor includes two separate but partially overlapping gates to reduce the electric field near the drain-channel interface region and, thereby, has an increased gated-diode breakdown voltage.

6 Claims, 5 Drawing Sheets

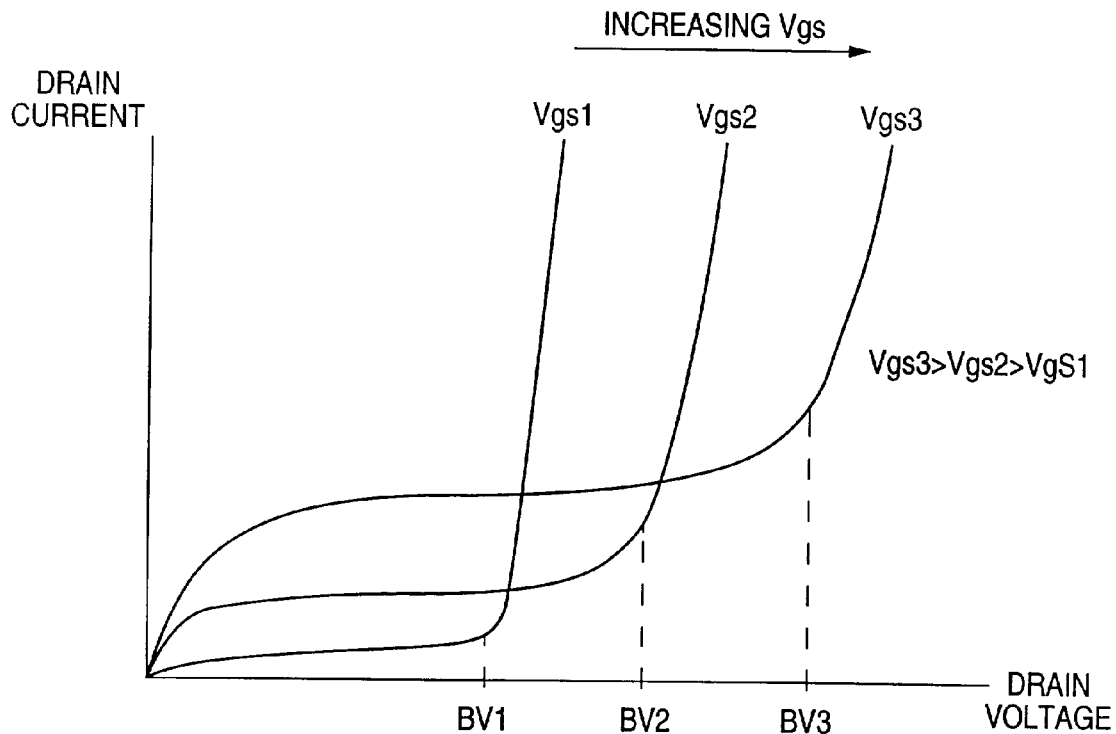
FIG. 2B
(PRIOR ART)
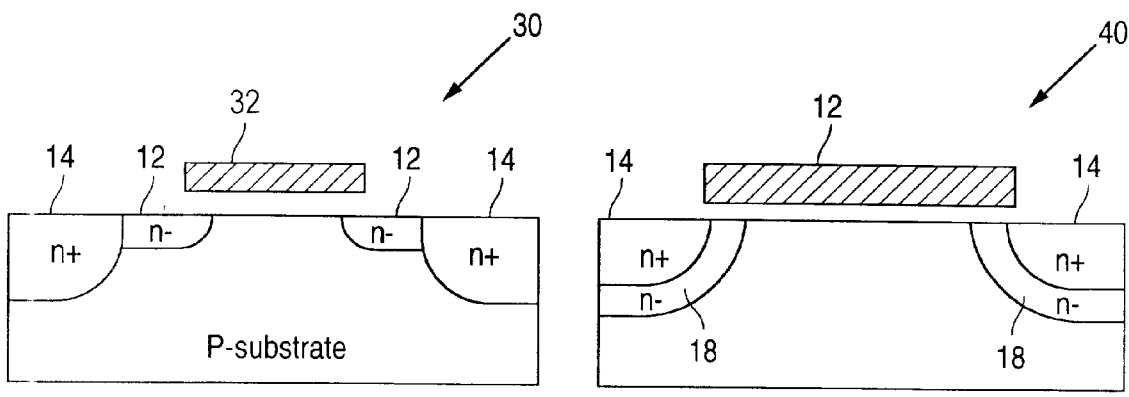
FIG. 3
(PRIOR ART)
FIG. 4
(PRIOR ART)

HIGH VOLTAGE SPLIT GATE CMOS TRANSISTORS BUILT IN STANDARD 2-POLY CORE CMOS

BACKGROUND OF THE INVENTION

Many Integrated Circuits (ICs) require a high voltage to operate. Among such ICs are the so called non-volatile memory ICs, which include EPROMs, EEPROMs and Flash-EPROMs. For a non-volatile memory IC, a high voltage, generated either internally or provided externally, is needed in order to program or erase the memory transistors that are used to store data.

In recent years demand for integrating different classes of functions, which until recently required several different ICs to achieve, has arisen. Combining the functions performed by several ICs into a single IC requires the development of new transistor structures capable of operating under different biasing conditions. ICs containing both non-volatile memory devices, e.g. memory transistors and the supporting circuitry, as well as circuits performing a variety of analog and digital functions are currently available in the market. Furthermore, a new generation of ICs use embedded Flash-EPROM memory transistors to program or erase a programmable logic device formed within the same IC.

In most such ICs, one or more p-channel or n-channel MOS transistors are typically placed in the path that carries a high voltage to the memory transistors. MOS transistors are employed in the high voltage path to either pass the high voltage to or inhibit the high voltage from being applied to the memory transistor during a programming/erase cycle. When an n-channel MOS transistor is used to inhibit a positive high voltage from being applied to a memory transistor, it must be able to withstand the high voltage that is applied to its drain terminal without entering a gated-diode breakdown region.

FIG. 1 shows the biasing condition that an n-channel MOS transistor 10 experiences when it is used to block a high voltage 30 applied to its drain terminal 24. As can be seen from FIG. 1, gate terminal 22 and source terminal 26 of transistor 10 are connected to ground while a high voltage 30 is applied to the transistor drain terminal 24.

To prevent transistor 10 from entering the gated-diode breakdown region, the electric field near the interface between drain 14 and channel 18 must be reduced.

One method of reducing the electric field near the drain-channel interface is to raise the potential of gate 12. For example, in FIG. 2A voltage supply 40 is applied to raise the potential of gate terminal 22. FIG. 2B illustrates the effect of increasing the gate-to-source voltage $V_{gs}$ of n-channel MOS transistor 10 on the transistor gated-diode breakdown voltage characteristic. In FIG. 2B, the x-axis designates the drain-to-source voltage $V_{ds}$ and the y-axis designates the drain current $I_{ds}$ flowing through drain terminal 24. Three graphs of drain current as a function of drain voltage are shown in FIG. 2B, with each graph representing a different gate-to-source $V_{gs}$ voltage. As can be seen form FIG. 2B, as the magnitude of gate-to-source voltage $V_{gs}$ increases, the magnitude of gated-diode breakdown voltage BV also increases (i.e. BV3 has a greater magnitude than BV2.) However, the increase in the gate-to-source voltage $V_{gs}$ causes transistor 10 to turn on, rendering transistor 10 inoperable as a high voltage switching device.

Exposing a conventional p-channel or n-channel MOS transistor to a high voltage for an extended period of time leads to other undesirable effects. Most notably, a high electric field in a transistor channel region adjacent a drain causes electrons to be injected from the channel into the gate oxide. This phenomenon which is commonly known as the "hot electron effect" leads to many long-term problems, e.g. transistor performance degradation and reduced reliability. The high-voltage induced problems become more pronounced as transistor dimensions decrease.

Techniques developed to reduce the high electric field near the drain-channel interface in order to increase the gated-diode breakdown voltage and to reduce the hot electron effect typically modify the dopant concentration of the drain so as to create a more gradual and a reduced doping concentration at the drain-channel interface. Two such techniques, widely known in the art, are the Lightly Doped Drain (LDD) and the Double Diffused Drain (DDD).

FIG. 3 shows a prior art MOS transistor 30 which includes LDD regions 12, as described in "VLSI TECHNOLOGY", by S. M. Sze, published by McGraw-Hill International 1988, pages 482–483. The dopant concentration in n LDD regions 12 are several orders of magnitude smaller than those in n+ regions 14. The reduction in the electric field near the drain-channel region (or the source-channel region) stemming from the reduction in the dopant concentration near the drain-channel interface results in an increase in the gated-diode breakdown voltage for transistor 30.

A disadvantage of transistor 30 is that it requires extra masking and implant steps to form LDD regions 12.

FIG. 4 show a transistor 40 which includes DDD to lower the electric field and thereby increase the gated-diode breakdown voltage, as described in U.S. Pat. No. 4,851,360 issued to Haken et al. As shown in FIG. 4, both the source and the drain regions of transistor 40 include two diffusion regions 14 and 18. To form doubled diffused regions 14 and 18, a first mask is used to implant regions 14 with phosphorous. Thereafter, using the same mask, arsenic is implanted into the same region, subsequent to which transistor 20 is implant annealed. Because phosphorous atoms have a greater diffusivity than arsenic atoms, they diffuse laterally during the implant anneal process to form region 18 which has a lower dopant concentration than does adjacent region 14.

A disadvantage of transistor 40 is that DDD regions 14 increase the source/drain junction capacitances. The increase in the RC time constants, caused by the increase in source/drain junction capacitances leads to longer propagation delays and slower performance of circuits that use transistor 40.

Another disadvantage of transistor 40 is that it requires an extra implant step to form DDD regions 14.

SUMMARY OF THE INVENTION

In accordance with the present invention, a high voltage split gate MOS transistor has a reduced electric field near the drain-channel interface region and hence an increased gated-diode breakdown voltage. The split gate transistor includes two separate and distinct but partially overlapping gates. A first gate partially overlaps the source region and extends along a portion of the channel in an area located directly above the channel region. A second gate partially overlaps the drain region and extends along the remaining portion of the channel region.

The high voltage split gate MOS transistor does not require an additional fabrication processing step when constructed in a standard double-poly fabrication process.

BRIEF DESCRIPTION OF THE DRAWINGS

FIG. 2B depicts the effect of increasing the gate-to-source voltage of the n-channel MOS transistor of FIG. 2A on the transistor gated-diode breakdown voltage characteristic.

FIG. 3 depicts a prior art n-channel MOS transistor including a lightly diffused drain.

FIG. 4 depicts a prior art n-channel MOS transistor including a double diffused drain.

DETAILED DESCRIPTION

Figure 1:
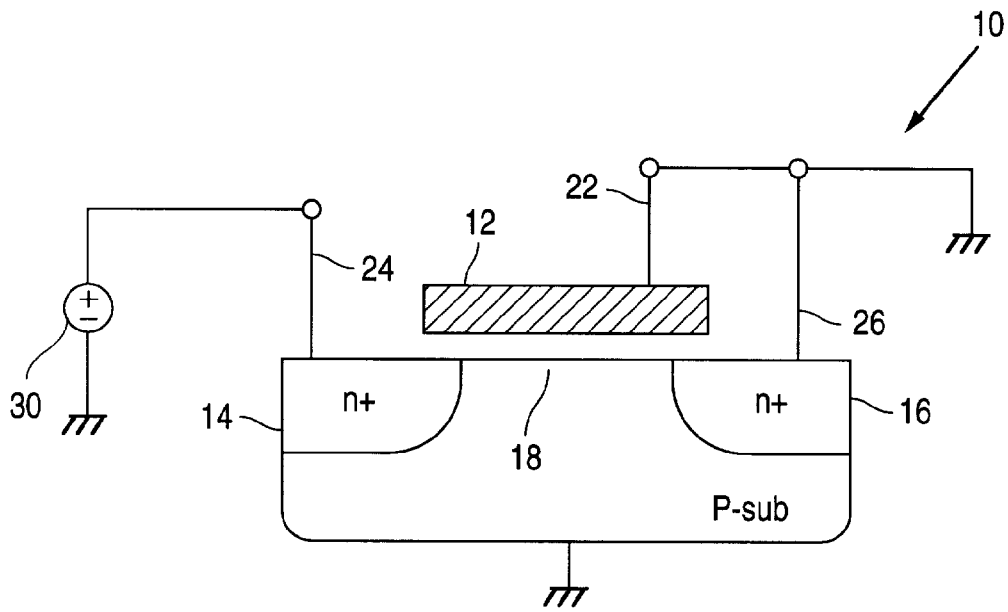
FIG. 1 depicts an n-channel MOS transistor configured to block a high voltage applied to its drain terminal.
Figure 2A:
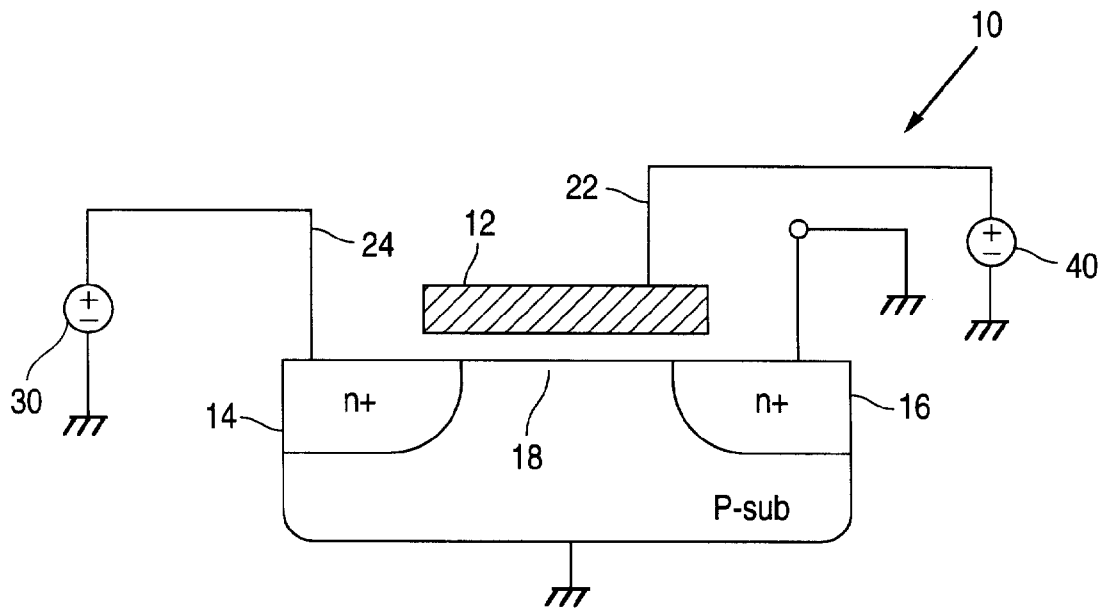
FIG. 2A depicts an n-channel MOS transistor which has its gate and drain terminals connected to a positive voltage supply and which has its source and substrate terminals connected to ground.
Figure 5:
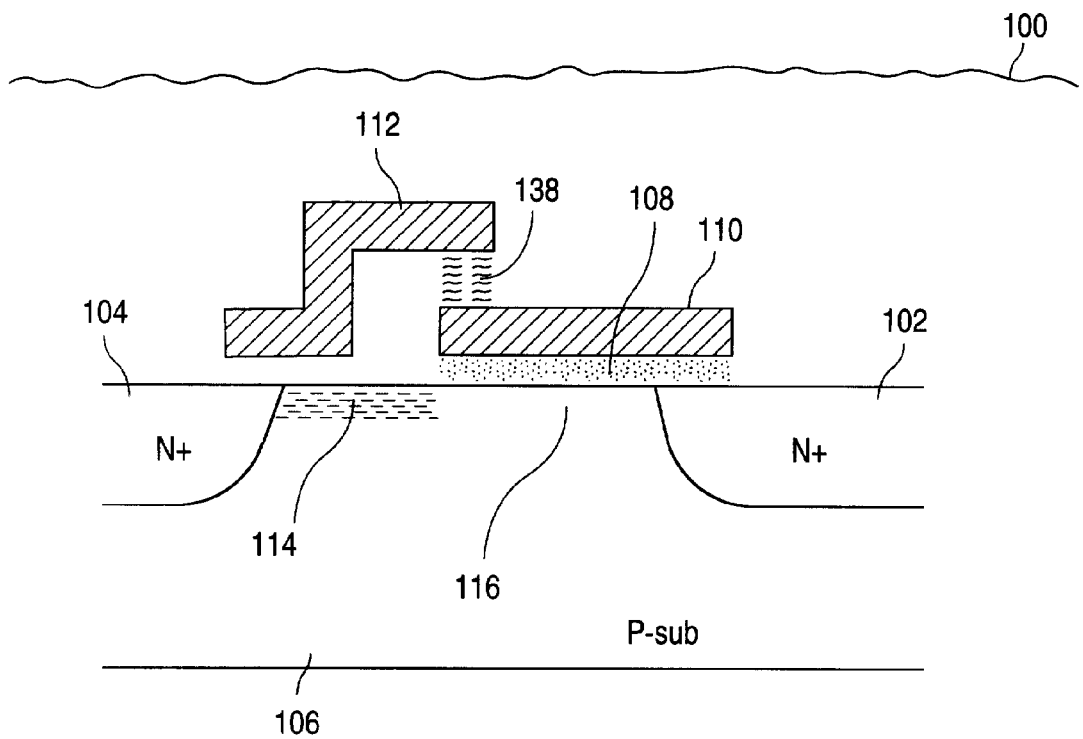
FIG. 5 depicts a high voltage n-channel MOS split gate transistor, in accordance with the present invention.

As shown in FIG. 5, a high voltage n-channel MOS split gate transistor 100, in accordance with the present invention, includes: an n-type source 102, an n-type drain 104, a p-type substrate 106, a gate oxide 108, a first channel region 114, a second channel region 116, a first poly-silicon gate 110 and a second poly-silicon gate 112. Poly-silicon gates 110 and 112 partially overlap each other to form an overlap region 138 which is filled by a dielectric material, e.g. silicon-dioxide. Overlap region 138, which is defined by a lower surface of poly-silicon 112 and an upper surface of poly-silicon 110 ensures that a continuous channel is formed between source 102 and drain 104 when so required.

Transistor 100 when fabricated using a standard double-poly non-volatile memory Integrated Circuit (IC) fabrication process requires no additional processing step. Poly-silicon gates 110 and 112 are formed and patterned after the first and second poly-silicon layer deposition steps of a standard double-poly non-volatile memory IC fabrication process, respectively. Therefore, transistor 100 is ideally suited for use as a high voltage switch in a non-volatile memory IC.

Figure 6:
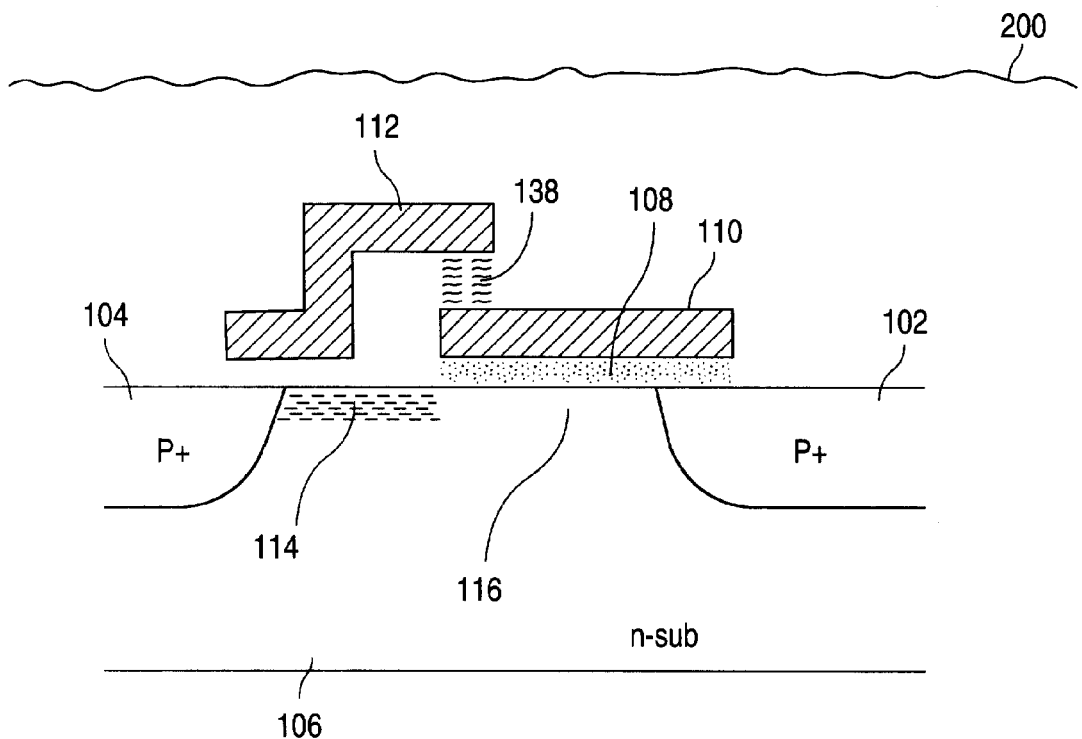
FIG. 6 depicts a high voltage p-channel MOS split gate transistor, in accordance with the present invention.

FIG. 6 depicts a high voltage PMOS split gate transistor 200, in accordance with the present invention. PMOS transistor 200 includes: a p-type source 102, a p-type drain 104, an n-type substrate 106, a gate oxide 108, a first channel region 114, a second channel region 116, a first poly-silicon gate 110 and a second poly-silicon gate 112. Poly-silicon gates 110 and 112 partially overlap each other to form an overlap region 138, defined by a lower surface of poly-silicon 112 and an upper surface of poly-silicon 110, which is filled by a dielectric material, e.g. silicon-dioxide. It is understood that the discussion below applies equally to both n-channel and p-channel high voltage split gate MOS transistors and as such only the operation of n-channel transistors is discussed.

Figure 7:
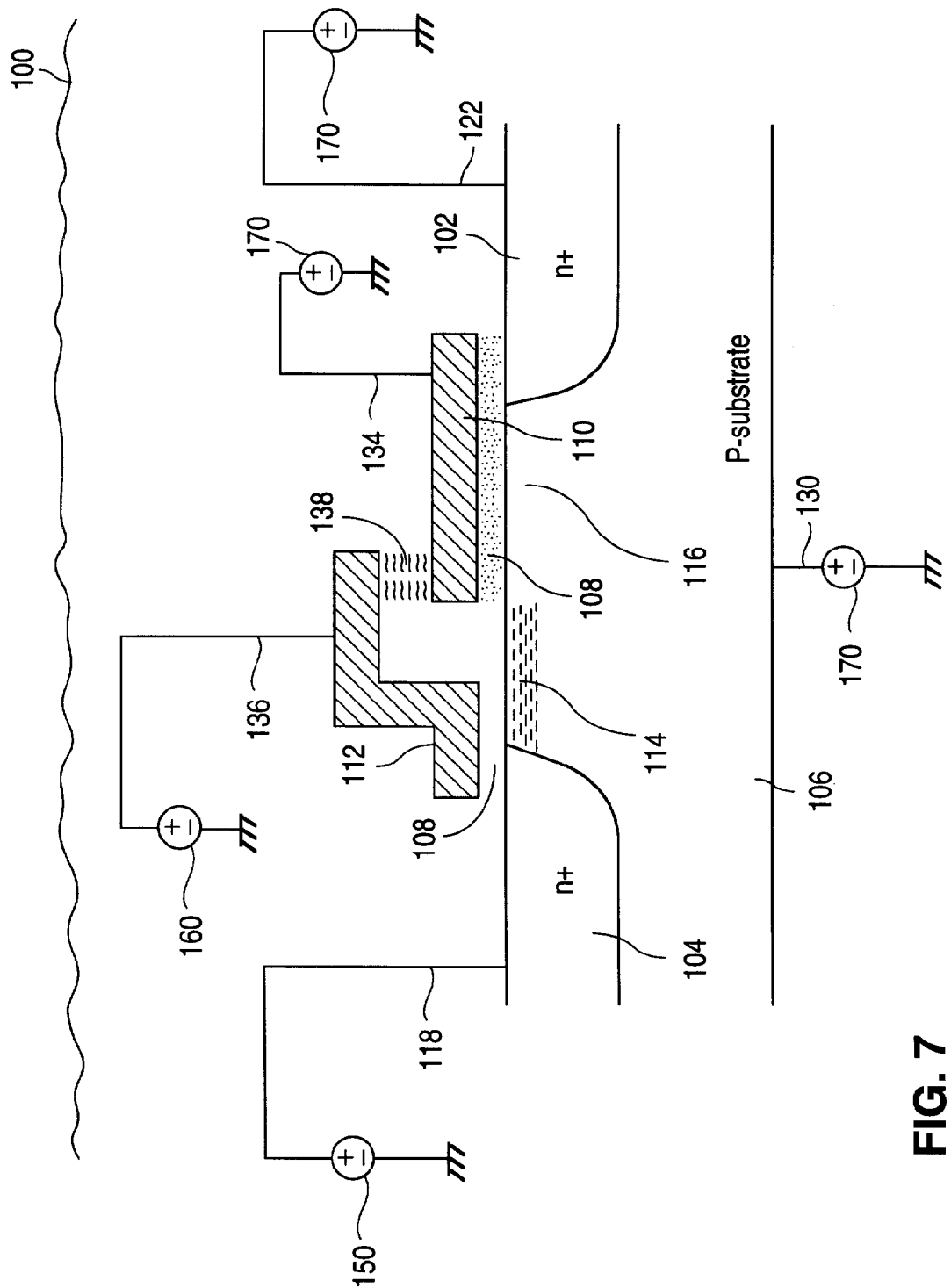
FIG. 7 depicts a high voltage n-channel MOS split gate transistor configured to block a high voltage applied to its drain terminal.

FIG. 7 shows the voltages that are applied to transistor 100 when placed in a high voltage path, e.g. a programming path, of a memory transistor (not shown) that is not to be programmed during a programming cycle, requiring transistor 100 to inhibit the high voltage from being applied to the memory transistor. When configured to block a high voltage, the typical voltages applied to various terminals of transistor 100 are as follows: voltage supply 150, which is typically at twelve volts, is applied to drain terminal 118; voltage supply 170, which is typically at zero volts, is applied to source terminal 122, substrate terminal 130 and first gate terminal 134; voltage supply 160, which is typically at five volts, is applied to second gate terminal 136. The above biasing voltages place transistor 100 in what is commonly known in the art as a gate-diode configuration mode.

Transistor 100, as shown in FIG. 7, blocks the high voltage 150 applied to its drain terminal 118 while advantageously avoiding the gated-diode breakdown. Voltage supply 160 applied to gate terminal 136 inverts channel region 114, thereby, reducing the electric field near the drain-channel interface region. As a result, the gated-diode breakdown voltage increases, allowing transistor 100 to sustain high voltage 150 without entering the gated-diode breakdown region. Advantageously, because gate 110 is held at zero volts, channel region 116 remains uninverted keeping transistor 100 in an off state.

Figure 8:
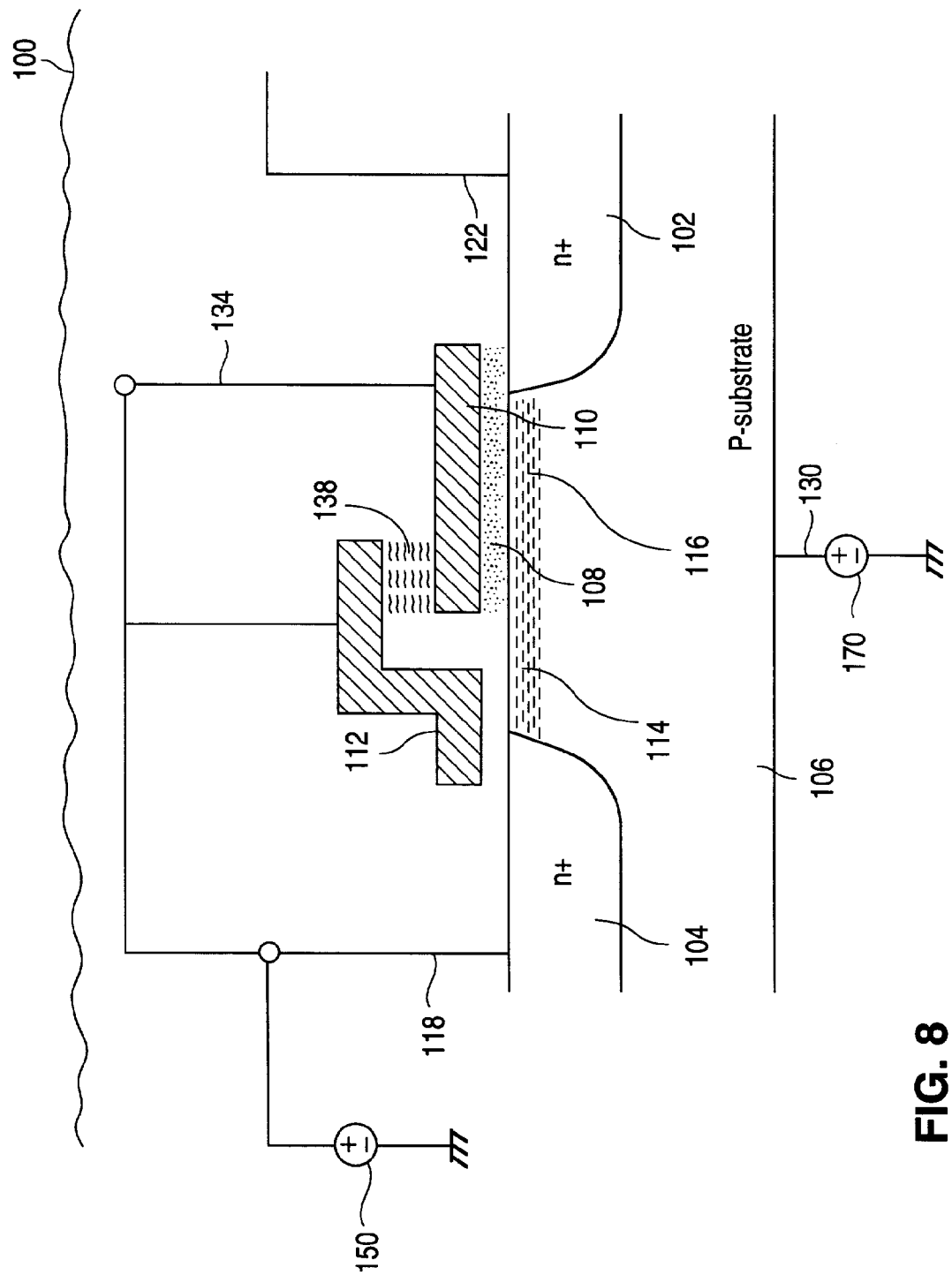
FIG. 8 depicts a high voltage n-channel MOS split-gate transistor configured to pass a high voltage applied to its drain terminal.

FIG. 8 shows the voltages that are applied to transistor 100 when placed in a high voltage path, e.g. a programming path, of a memory transistor (not shown) that is to be programmed during a programming cycle, requiring transistor 100 to pass the high voltage to the memory transistor. As can be seen from FIG. 8, when acting as a high voltage passing device the voltages applied to various terminals of transistor 100 are as follows: voltage supply 150, which is typically at twelve volts, is applied to drain terminal 118 and first and second gate terminals 134 and 136; voltage supply 170, which is typically at zero volts, is applied to substrate terminal 130. Source terminal 122 is connected to a circuitry which delivers the high voltage to memory transistors (not shown).

As shown in FIG. 8, transistor 100 is configured to operate in the normal active mode. Voltage supply 150 applied to gate terminals 134 and 136 inverts channel regions 114 and 116, thereby forming a conduction path between the source and drain terminals of the transistor. Transistor 100 thus configured passes high voltage 150 from its drain terminal 118 to its source terminal 122.

The split-gate MOS transistor, advantageously reduces the electric field near its drain-channel interface region without requiring additional processing steps when manufactured using a standard double-poly CMOS process, therefore, it is constructed at no additional cost. The reduction in the electric field prevents the transistor from entering the gated-diode breakdown region when the transistor is used as a high voltage switching device.

The split-gate MOS transistor advantageously minimizes hot-electron induced effects and, consequently, enjoys a diminished performance degradation and offers improved reliability.

I claim:

1. A method for blocking a voltage comprising:
    applying the voltage to a drain region of a split-gate MOS transistor;
    applying a second voltage to a source region and to a substrate region of the split-gate MOS transistor, the substrate region defining a channel area separating the source and the drain regions;
    applying the second voltage to a first gate of the split-gate MOS transistor, the first gate overlapping a portion of the source region and extending along a portion of said channel area; and
    applying a third voltage to a second gate of the split-gate MOS transistor, the second gate overlapping a portion of the drain region and the first gate, and extending along a remaining portion of the channel area, wherein a dielectric material separates the first and second gates from one another and from the substrate, wherein the third voltage is greater than the second voltage, wherein the first voltage is greater than the third voltage and is blocked from reaching the source region, and wherein the split-gate MOS transistor does not enter the gated-diode breakdown region.

2. The method of claim 1 wherein the first and second gates are made from polysilicon.

3. The method of claim 1 wherein the overlapping region between the first gate and the second gate is defined by a section of the second gate that is located at a level above the first gate.

4. A method for passing a voltage comprising:

applying the voltage to a drain region of a split-gate MOS transistor;

applying a second voltage to a substrate region of the split-gate MOS transistor, the substrate region defining a channel area separating a source region and the drain region of the split-gate MOS transistor;

applying the first voltage to a first gate of the split-gate MOS transistor, the first gate overlapping a portion of the source region and extending along a portion of said channel area; and applying the first voltage to a second gate of the split-gate MOS transistor, the second gate overlapping a portion of the drain region and the first gate, and extending along a remaining portion of the channel area, wherein a dielectric material separates the first and second gates from one another and from the substrate, wherein the first voltage is greater than the second voltage and is passed from the drain region to the source region of the split-gate MOS transistor.

5. The method of claim 4 wherein the first and second gates are made from poly-silicon.

6. The method of claim 4 wherein the overlapping region between the first gate and the second gate is defined by a section of the second gate that is located at a level above the first gate.

* * * * *